United States Patent [19]

Someno

[11] Patent Number: 5,325,269
[45] Date of Patent: Jun. 28, 1994

[54] APPARATUS HAVING PLURALITY OF PLUG-IN PACKAGES DETACHABLY HOUSED IN HOUSING THEREOF

[75] Inventor: Syouji Someno, Kawasaki, Japan

[73] Assignee: Fujitsu Limited, Kawasaki, Japan

[21] Appl. No.: 878,410

[22] Filed: May 4, 1992

[30] Foreign Application Priority Data

May 7, 1991 [JP] Japan .................................. 3-101593

[51] Int. Cl.$^5$ .............................................. H05K 1/14
[52] U.S. Cl. .................... 361/796; 361/785; 439/629; 439/630; 439/631; 439/43
[58] Field of Search ............... 361/412, 413, 414, 415, 361/395, 399; 439/44, 43, 45, 46, 47, 48, 374, 376, 377, 629, 630, 631, 632, 60; 211/41

[56] References Cited

U.S. PATENT DOCUMENTS 5,057,968 10/1991 Morrison .............................. 361/415
5,218,519 6/1993 Welch et al. ......................... 361/415

Primary Examiner—Leo P. Picard
Assistant Examiner—Bot Ledynh
Attorney, Agent, or Firm—Armstrong, Westerman, Hattori, McLeland & Naughton

[57] ABSTRACT

An apparatus according to the present invention is capable of housing a plurality of plug-in packages, each plug-in package being provided with a first connector. The apparatus includes, a housing having a front panel on which a plurality of insertion openings is provided through which openings the plug-in packages can be inserted into the housing, a first edge of each of the plug-in packages leading and a second edge of each of the plug-in packages trailing when inserting, a mother board mounted in the housing, the mother board having a plurality of second connectors fixed thereon, each second connector corresponding to one of the insertion openings formed on the panel, and a supporting member for pivotably supporting the first edge of each of the plug-in packages which was inserted in the housing so that the first connector faces to a corresponding one of the second connectors of the mother board. Each of the plug-in packages is pivoted so that the first connector of each of the plug-in packages is connected to a corresponding one of the second connectors of the mother board.

26 Claims, 15 Drawing Sheets

APPARATUS HAVING PLURALITY OF PLUG-IN PACKAGES DETACHABLY HOUSED IN HOUSING THEREOF

BACKGROUND OF THE INVENTION (1) Field of the Invention

The present invention generally relates to an apparatus, such as a communication equipment, having a plurality of plug-in packages detachably housed in a housing thereof.

(2) Description of Related Art

A communication equipment 1 generally has a structure as shown in FIG. 1. That is, a plurality of communication units 3-1, 3-2, 3-3 and 3-4 are mounted in a cabinet 2 so as to be stacked on each other. The communication units 3-1, 3-2, 3-3 and 3-4 are respectively provided with plug-in packages 5-1, 5-2, 5-3 and 5-4, in each of which plug-in packages an electric circuit for performing a predetermined function is provided. A plurality of plug-in packages are detachably housed in a housing (4-1, 4-2, 4-3 and 4-4) of each of the communication units. To change functions of the communication equipment 1, the plug-in packages must be replaced or additional plug-in packages must be added in at least one of the communication units 3-1, 3-2, 3-3 and 3-4. Thus, it is preferable that each of the plug-in packages be capable of being set in each of the communication units without pulling out the communication units from the cabinet. In addition, to prevent the height of the cabinet of the communication equipment from increasing, it is preferable that each of the communication units be as thin as possible.

FIG. 2 shows a conventional structure of a communication unit having a plurality of plug-in packages detachably housed in a housing thereof.

Referring to FIG. 2, a housing 4 of a communication unit 3 has a plurality of insertion openings 11 formed at predetermined intervals on a front surface 10 thereof. A back board 12 is mounted, in the housing 4, at a position close to the rear surface opposite to the front surface 10 of the housing 4. Each of plug-in packages 5 has a circuit board 16 and a plug-in connector 14 mounted at an end of the circuit board 16. A plurality of connectors 15 are fixed on the back board 12, each of the connectors 15 corresponding to one of the insertion openings 11. Each of the plug-in packages 5 is inserted into the housing 4 via one of the insertion openings 11 in a direction shown by an arrow in FIG. 2. Then, the plug-in connector 14 is connected with a corresponding one of the connectors 15. That is, the plug-in packages 5 are mounted in the housing 4 in a state where the plug-in connector 14 of each of the plug-in packages 5 is connected with a respective connector 15 fixed on the back board 12.

In the above conventional communication unit 3, the plug-in packages 5 are inserted into the housing 4 from the front surface 10 side of the housing 4. Thus, each of the plug-in packages 5 can be inserted into the housing 4 without pulling out the communication unit from the cabinet 2. However, as each of the communication units must be as thin as possible, the size of the back board 15 to which the plug-in packages 5 are electrically connected becomes small. Thus, the back board 12 cannot be used as a mother board on which a circuit for operating the plug-in packages 5 is formed. The circuit to be formed on the mother board is referred to as a common circuit. In each conventional communication unit, the common circuit is separately formed on some of the plug-in packages. Thus, the number of plug-in packages to be housed in the housing of each communication unit increases, so that the size (the width) of the housing of each of the communication units increases.

SUMMARY OF THE INVENTION

Accordingly, a general object of the present invention is to provide a novel and useful apparatus having a plurality of plug-in packages detachably housed in a housing hereof in which the disadvantages of the aforementioned prior art are eliminated.

A more specific object of the present invention is to provide an apparatus, having a plurality of plug-in packages detachably housed in a housing thereof, capable of being down sized.

The above objects of the present invention are achieved by an apparatus capable of housing a plurality of plug-in packages, each being provided with a first circuit and a first connector having contact pins coupled to the first circuit, the apparatus comprising: a housing having a panel on which a plurality of insertion openings are provided through which openings the plug-in packages can be inserted into the housing, a first edge of each of the plug-in packages leading and a second edge of each of the plug-in packages trailing when inserting; a mother board mounted in the housing, the mother board having a second circuit and a plurality of second connectors fixed thereon, each second connector having contact pins coupled to the second circuit and corresponding to one of the insertion openings formed on the panel; and a first supporting member for pivotably supporting the first edge of each of the plug-in packages which was inserted in the housing so that the first connector faces a corresponding one of the second connectors of the mother board, wherein each of the plug-in packages is pivoted so that the first connector of each plug-in package is connected to a corresponding one of the second connectors of the mother board.

According to the present invention, as a plurality of plug-in packages are connected to the mother board, a circuit required for operating the plug-in packages can be formed on the mother board. Thus, the number of plug-in packages to be housed in the apparatus can decrease. That is, the apparatus such as the communication unit can be miniaturized in comparison with a conventional apparatus.

Additional objects, features and advantages of the present invention will become apparent from the following detailed description when read in conjunction with the accompanying drawings.

DESCRIPTION OF THE PREFERRED EMBODIMENTS

A description will now be given of an embodiment of the present invention with reference to FIGS. 3 through 15.

Figure 1:
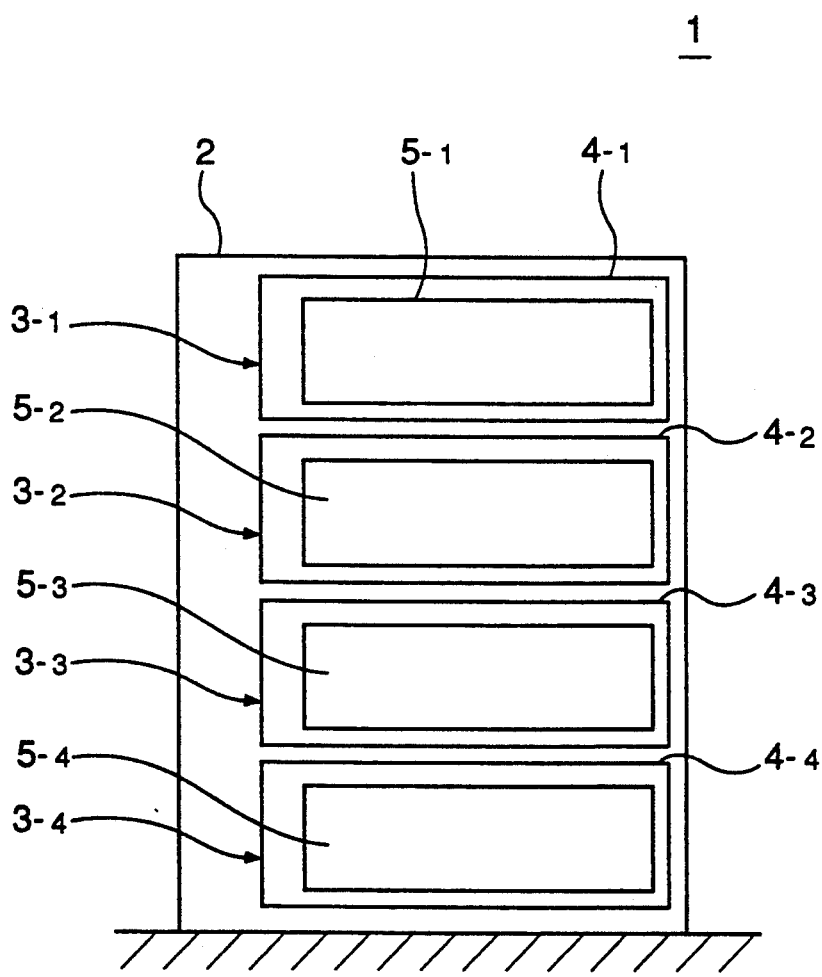
FIG. 1 is a diagram illustrating a conventional structure of a communication equipment in which a plurality of communication units are mounted in a cabinet.
Figure 2:
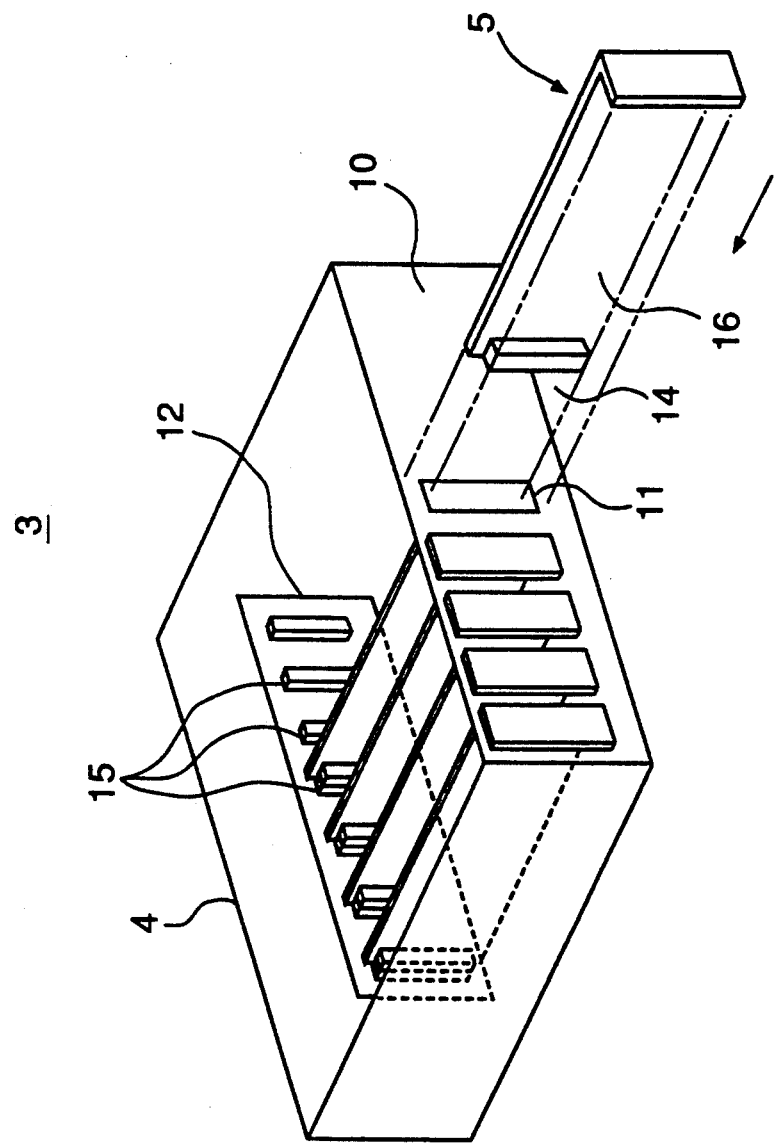
FIG. 2 is a diagram illustrating a conventional communication unit having a plurality of plug-in packages detachably housed in a housing thereof.
Figure 3:
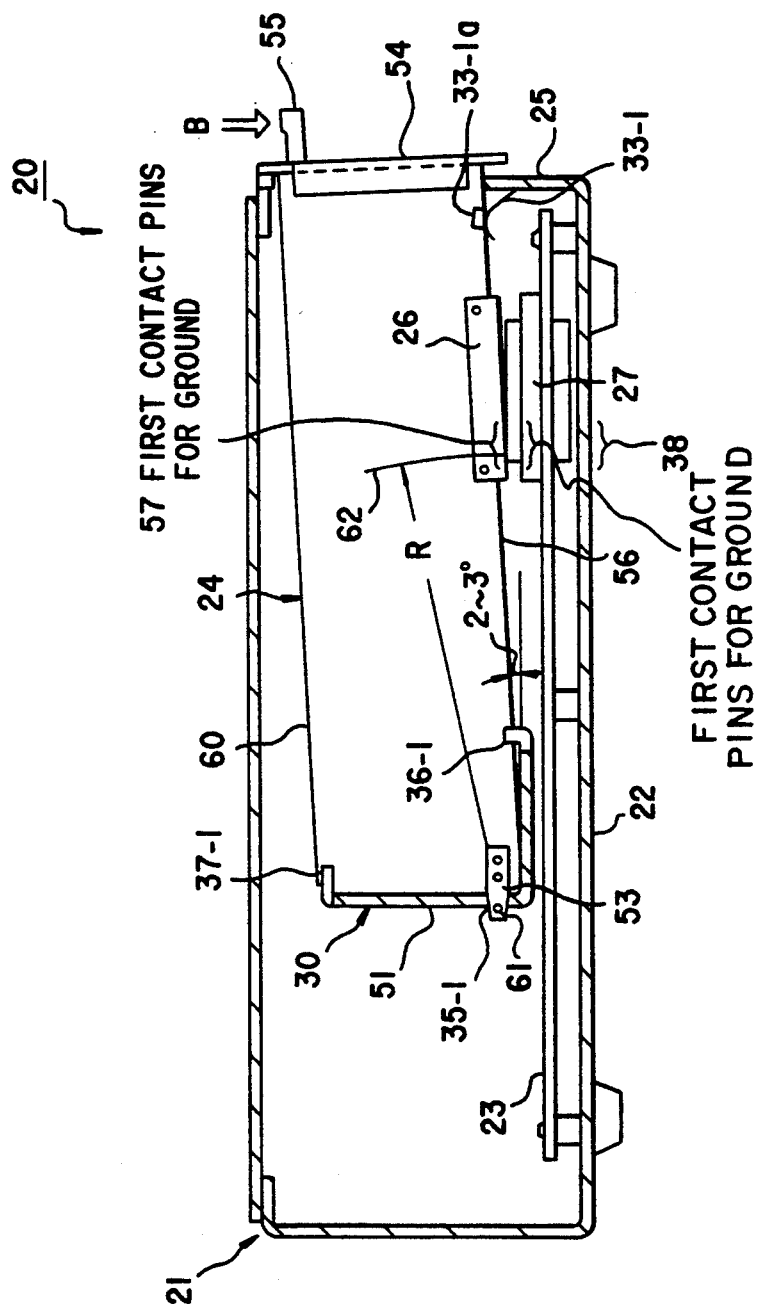
FIG. 3 is a cross sectional view showing a communication unit according to an embodiment of the present invention.

FIG. 3 shows a communication unit under a condition in which a plug-in package is inserted in a housing, but before completely setting the plug-in package in the housing.

Referring to FIG. 3, a communication unit 20 has a housing 21, plug-in packages 24 detachably housed in the housing 21, a mother board 23 mounted in the housing 21. A common circuit required for operating the plug-in packages 24 is formed on the mother board 23. The plug-in packages 24 are arranged so as to be approximately perpendicular to the mother board 23. Each of the plug-in packages 24 has a plug-in connector 26 and the mother board 23 has plug-in connectors 27 each corresponding to the plug-in connector 26 of each of the plug-in packages 24.

Figure 4:
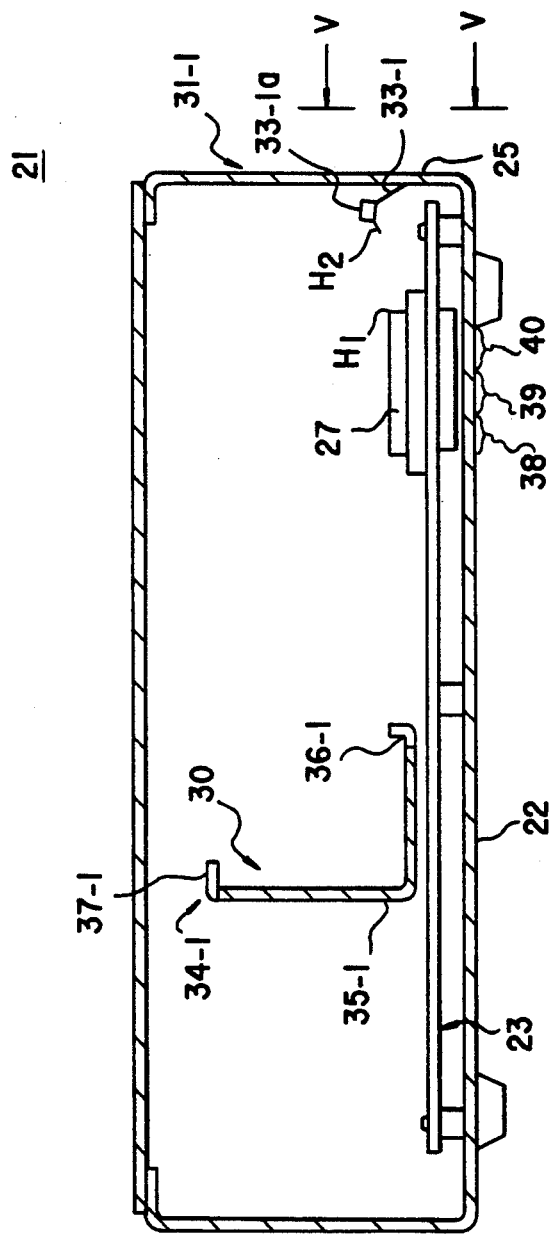
FIG. 4 is a cross sectional view showing a housing of the communication unit shown in FIG. 3.

The housing 21 is formed as shown in FIG. 4. Referring to FIG. 4, the housing 21 which is rectangular has a bottom plate 22 and a front panel 25 perpendicular to the bottom plate 22. The mother board 23 is fixed on the bottom plate 22 by screws. The plug-in connector 27 is fixed on the mother board 23 at a position close to the front panel 25. The plug-in connector 27 has first contact pins 38 connected to a ground, second contact pins 39 connected to a power supply and third contact pins 40 connected to signal lines on the mother board 23. The first contact pins 38, the second contact pins 39 and the third contact pins 40 are arranged from an interior part of the housing 21 toward the front panel 25 in this order.

Figure 6:
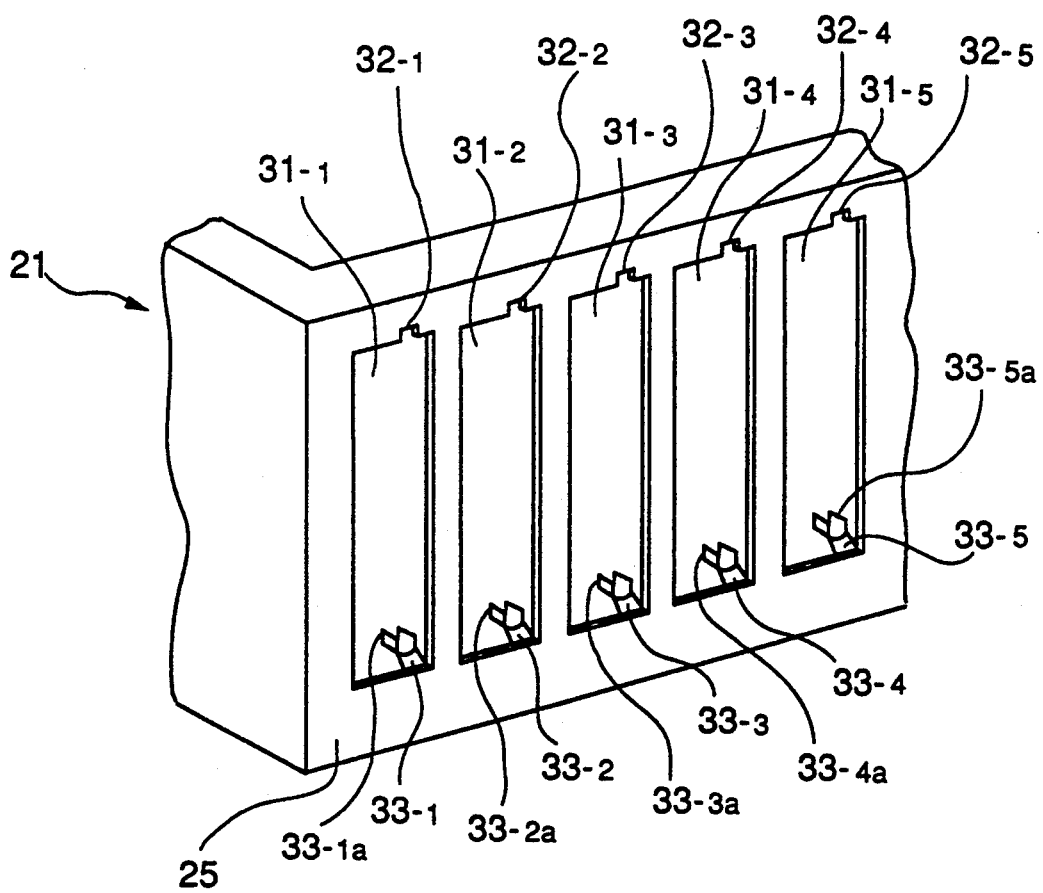
FIG. 6 is a diagram illustrating insertion openings formed on a front panel of the housing.
Figure 7:
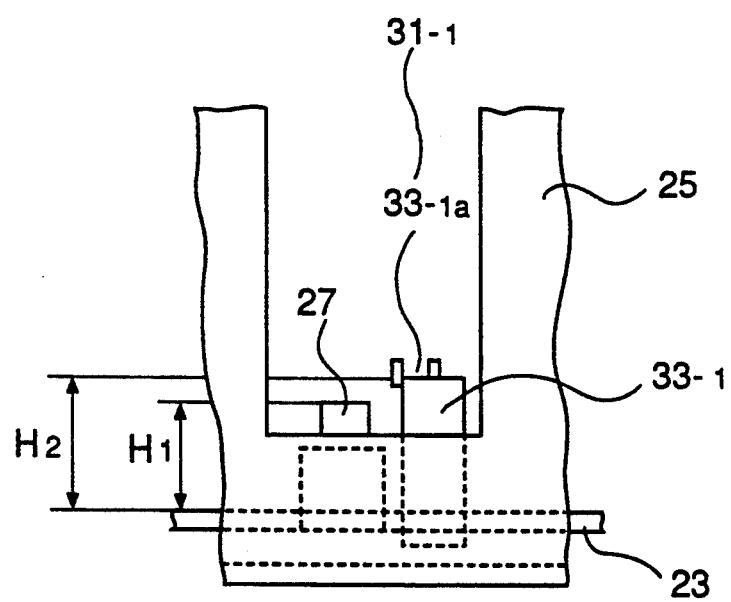
FIG. 7 is a diagram illustrating a leaf spring formed on an edge of each of the insertion openings of the front panel.

The front panel 25 has a structure as shown in FIG. 6. Referring to FIG. 6, insertion openings 31-1, 31-2, 31-3, 31-4 and 31-5 are formed on the front panel 25 so as to be arranged at predetermined intervals. Respective guide grooves 32-1, 32-2, 32-3, 32-4 and 32-5 are formed on upper edges of respective insertion openings 31-1, 31-2, 31-3, 31-4 and 31-5. Respective leaf springs 33-1, 33-2, 33-3, 33-4 and 33-5 are fixed on lower edges of respective insertion openings 31-1, 31-2, 31-3, 31-4 and 31-5 so as to project toward the inside of the housing 21 in an incline upper direction. U-shaped support members 33-1a, 33-2a, 33-3a, 33-4a and 33-5a are mounted at ends of the leaf springs 33-1, 33-2, 33-3, 33-4 and 33-5. Each of the U-shaped support members (33-1a)-(33-5a) and corresponding ones of the guide grooves (32-1)-(32-5) are positioned in a plane perpendicular to the bottom plate 22 of the housing 21. A height position H2 of each of the U-shaped support members (33-1a)-(33-5a) is higher than a height position H1 of a surface of each of the plug-in connectors 27 mounted on the mother board 23, as shown in FIG. 7. When each of the plug-in packages 24 is inserted into a respective insertion opening (31-1)-(31-5), each of the plug-in packages 24 is supported by a corresponding one of the U-shaped supporting members (33-1a)-(33-5a) on the leaf springs (33-1)-(33-5) and guided by a corresponding one of the guide grooves (32-1)-(32-5). Each of the leaf springs (33-1)-(33-5) has a spring constant such that it is hardly bent by a weight of respective plug-in package 24. For example, each of the leaf springs (33-1)-(33-5) is made of stainless steel and has a thickness falling within a range of 0.2-0.3 mm.

Figure 5:
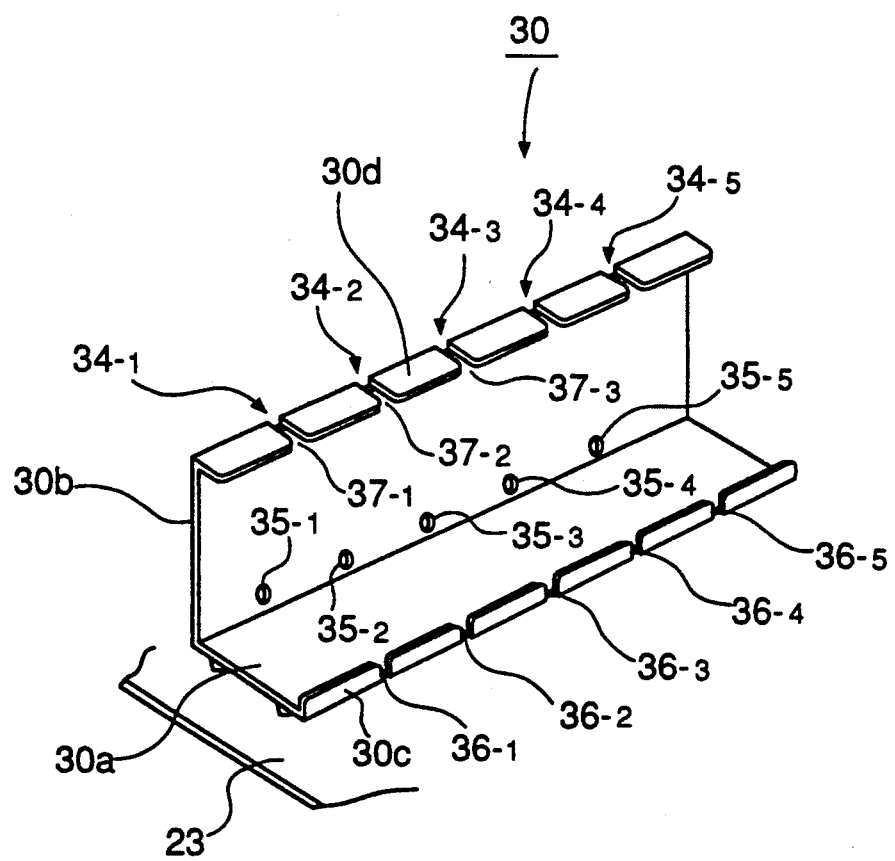
FIG. 5 is an L-shaped bracket provided on a mother board in the housing.

Return to FIG. 4, the L-shaped bracket 30 is mounted on the mother board 23 in the housing 21 so that a distance between the L-shaped bracket 30 and the front panel 25 corresponds to a length of each of the plug-in packages 24. The L-shaped bracket 30 has a structure shown in FIG. 5. Referring to FIG. 5, the L-shaped bracket 30 has a horizontal part 30a parallel to the mother board 23, a vertical part 30b parallel to the front panel 25 of the housing 21. A standing part 30c is formed at an end of the horizontal part 30a so as to project from the horizontal part 30a in a direction perpendicular thereto. A projection part 30d is formed at an end of the vertical part 30b so as to project from the vertical part 30b in a direction perpendicular thereto. Grooves 37-1, 37-2, 37-3, 37-4 and 37-5 are formed or the projection part 30d so as to be arranged at the same intervals as the insertion openings (31-1)-(31-5) formed on the front panel 25. Grooves 36-1, 36-2, 36-3, 36-4 and 36-5 are formed on the standing part 30c so as to correspond to the grooves (37-1)-(37-5) formed on the projection part 30d. Each of the grooves (37-1)-(37-5) and a corresponding one of the grooves (36-1)-(36-5) are positioned in the above plane in which corresponding guide groove and U-shaped supporting member formed at each insertion opening are positioned. Holes 35-1, 35-2, 35-3, 35-4 and 35-5 are formed at a lower portion of the vertical part 30b so as to be arranged at the same intervals as the grooves (37-1)-(37-5). Each group Consisting of one of the grooves (37-1)-(37-5), a corresponding one of the grooves (36-1)-(36-5) and a corresponding one of the holes (35-1)-(35-5) operates as one of holding parts 34-1, 34-2, 34-3, 34-4 and 34-5 for holding the leading edges of the plug-in packages 24.

Figure 8A:
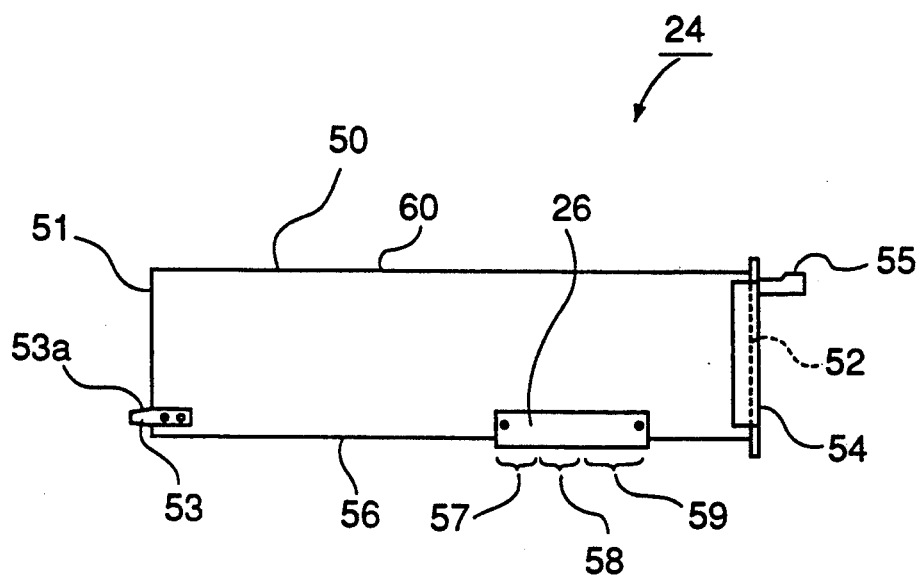
FIG. 8A is a side view showing a plug-in package.
Figure 8B:
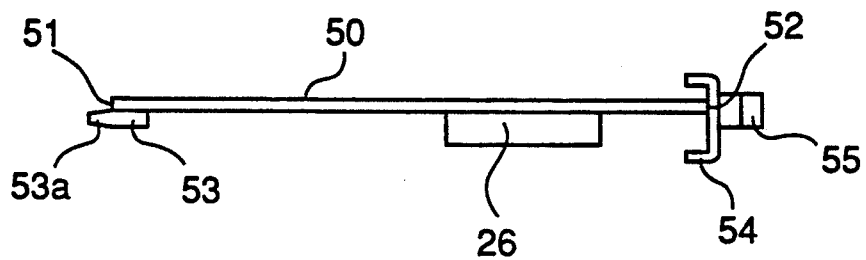
FIG. 8B is a plan view showing the plug-in package.

Each of the plug-in packages 24 is formed as shown in FIGS. 8A and 8B. Referring to FIGS. 8A and 8B, a plug-in package 24 has a circuit board 50 on which an electric circuit for a predetermined function is formed. The plug-in connector 26 is mounted on the circuit board 50 so that an end of the plug-in connector 26 projects from a lower edge 56 of the circuit board 50.

The plug-in connector 26 is positioned close to a trailing edge 52 of the circuit board 50. The plug-in connector 26 has first contact pins 57 to be connected to the ground, second contact pins 58 to be connected to the power supply and third contact pins 59 connected to signal lines formed on the circuit board 50. The first contact pins 57, second contact pins 58 and third contact pins 59 are arranged, in this order, in the plug-in connector 26 in a direction from the leading edge 51 toward the trailing edge 52. A pin 53 is mounted on the circuit board 50 so as to be along the lower edge 56 thereof and to project from the leading edge 51 thereof. A taper part 53a is formed at an end of the pin 53. A cover 54 having a U-shaped cross section is mounted on the trailing edge 52 of the circuit board 50. A lever 55 is fixed at a position, on the cover 54, close to an upper edge 60 of the circuit board 50.

The plug-in package 24 is set in the housing 21 of the communication unit 20 which is activated as follows.

The plug-in package 24 is completely set in the housing 21 in accordance with a procedure having a first step of inserting the plug-in package 24 into the housing 21 through a corresponding one of the insertion openings (31-1)-(31-5) and a second step of pushing down the lever 55 of the plug-in package 24.

Figure 9:
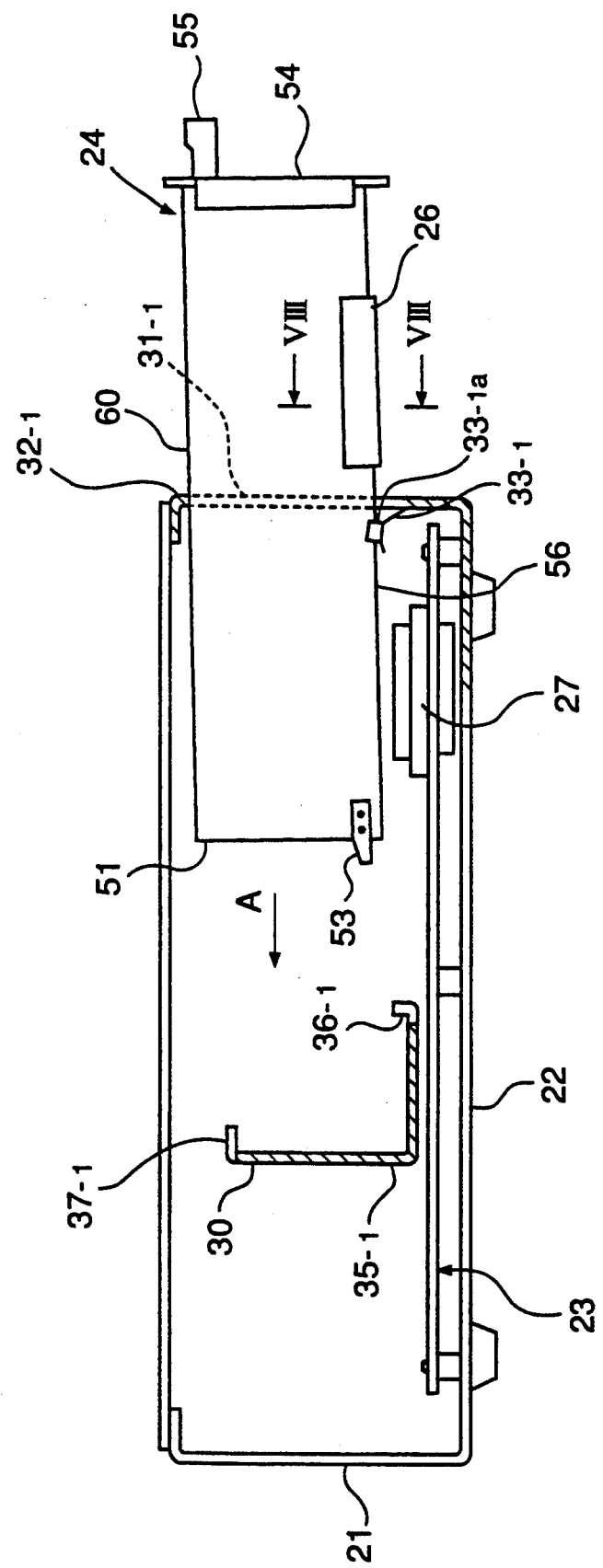
FIG. 9 is a diagram illustrating a state where a plug-in package is inserted into the housing of the communication unit.
Figure 10:
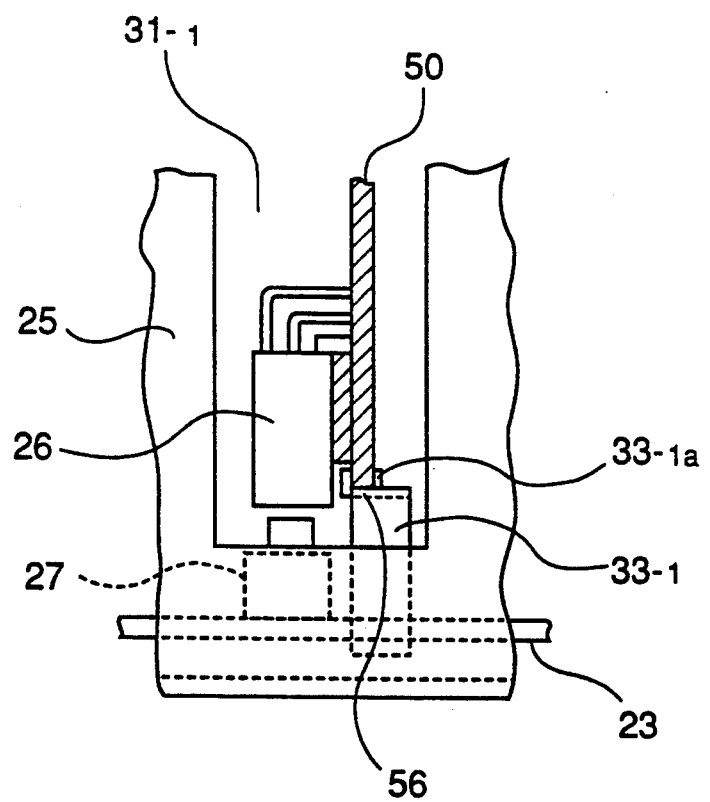
FIG. 10 is a diagram illustrating positions of plug-in connectors mounted on the plug-in package and the mother board.
Figure 11:
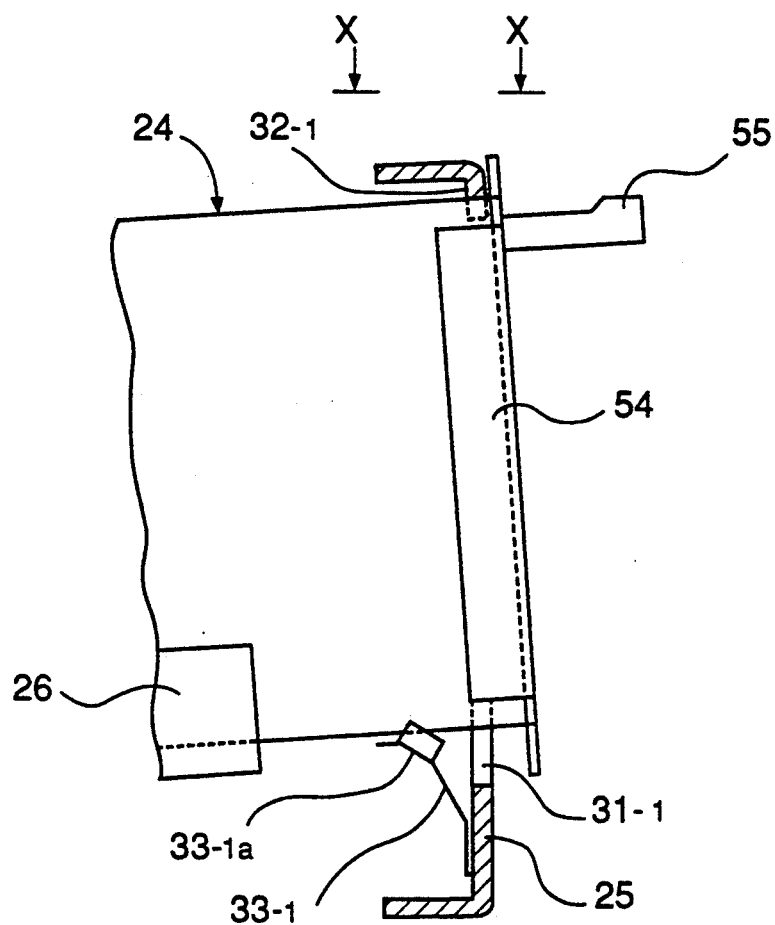
FIG. 11 is an enlarged diagram illustrating an end portion of the plug-in package, at which a cover is provided.
Figure 12:
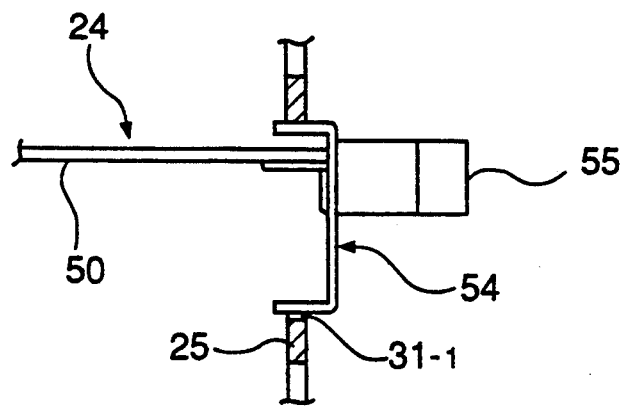
FIG. 12 is a view in an X-direction shown in FIG. 11.

In the first step, the plug-in package 24 is inserted into the housing 21 through one of the insertion openings (e.g. the insertion opening 31-1) under a condition in which the plug-in package 24 is perpendicular to the mother board 23, as shown in FIG. 9. That is, the lower edge 56 of the circuit board 50 of the plug-in package 24 slides on the U-shaped supporting member 33-1a of the leaf spring 33-1, and the upper edge 60 of the circuit board 50 thereof is engaged with the guide groove 32-1 formed at the insertion opening 31-1. As the circuit board 50 is guided by the guide groove 32-1 and the U-shaped supporting member 33-1a, the plug-in package 24 hardly moves in a direction perpendicular to a direction in which the plug-in package 24 is inserted. Thus, the plug-in package 24 is inserted into the housing 21 under a condition in which it is perpendicular to the mother board. In addition, as the U-shaped supporting member 33-1a is positioned at a position higher than a position of the surface of the plug-in connector 27 mounted on the mother board 23, the plug-in connector 26 mounted on the circuit board 50 of the plug-in package 24 does not contact the plug-in connector 27 on the mother board 23 when inserting. The plug-in package 24 is inserted into the housing 21 until the leading edge 51 of the circuit board 50 reaches the L-shaped bracket 30, as shown in FIG. 3. In this state, the leading edge 51 of the circuit board 50 is movably engaged with the groove 37-1 of the vertical part 30b of the L-shaped bracket 30, the lower edge 56 of the circuit board 50 is movably engaged with the groove 36-1 of the horizontal part 30a thereof, and the pin 53 provided on the leading edge of the plug-in package is smoothly engaged with the hole 35-1 provided on the L-shaped bracket 30. That is, an end portion of the plug-in package 24 is held by the holding part 34-1 of the L-shaped bracket 30. The plug-in connector 26 of the plug-in package 24 which has been completely inserted in the housing 21 faces the plug-in connector 27 mounted on the mother board 23, as shown in FIG. 10. The plug-in package 24 is supported by the U-shaped supporting member 33-1a of the leaf spring 33-1 and the L-shaped bracket 30, so that the plug-in package 24 is inclined by an angle in the range of 2-3° from the direction of insertion parallel to the mother board 23. The cover 54 of the plug-in package 24 is engaged with the insertion opening 31-1, as shown in FIGS. 11 and 12.

Figure 13:
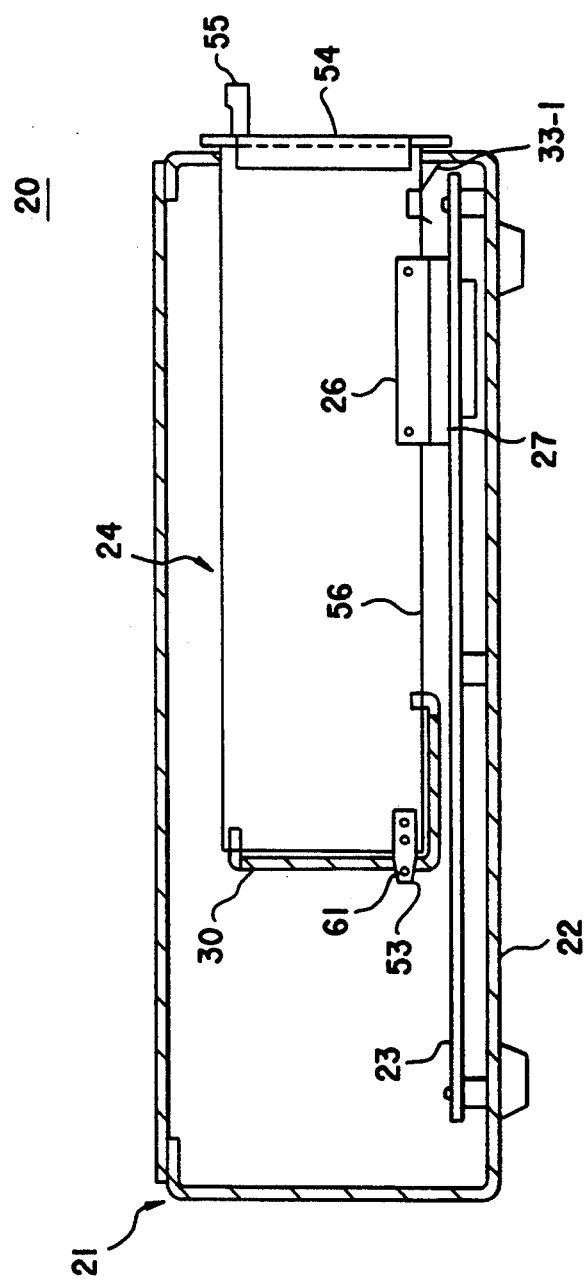
FIG. 13 is a cross sectional view showing the communication unit in which the plug-in package is completely set in the housing.
Figure 14:
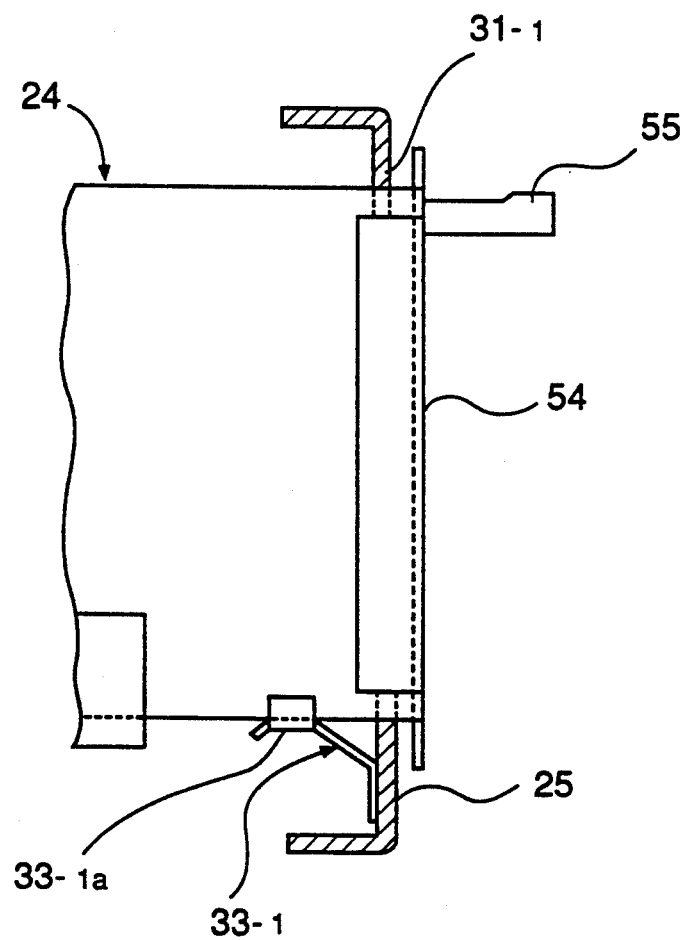
FIG. 14 is an enlarged diagram illustrating an end portion of the plug-in package, at which the cover is provided, completely housed in the housing.
Figure 15:
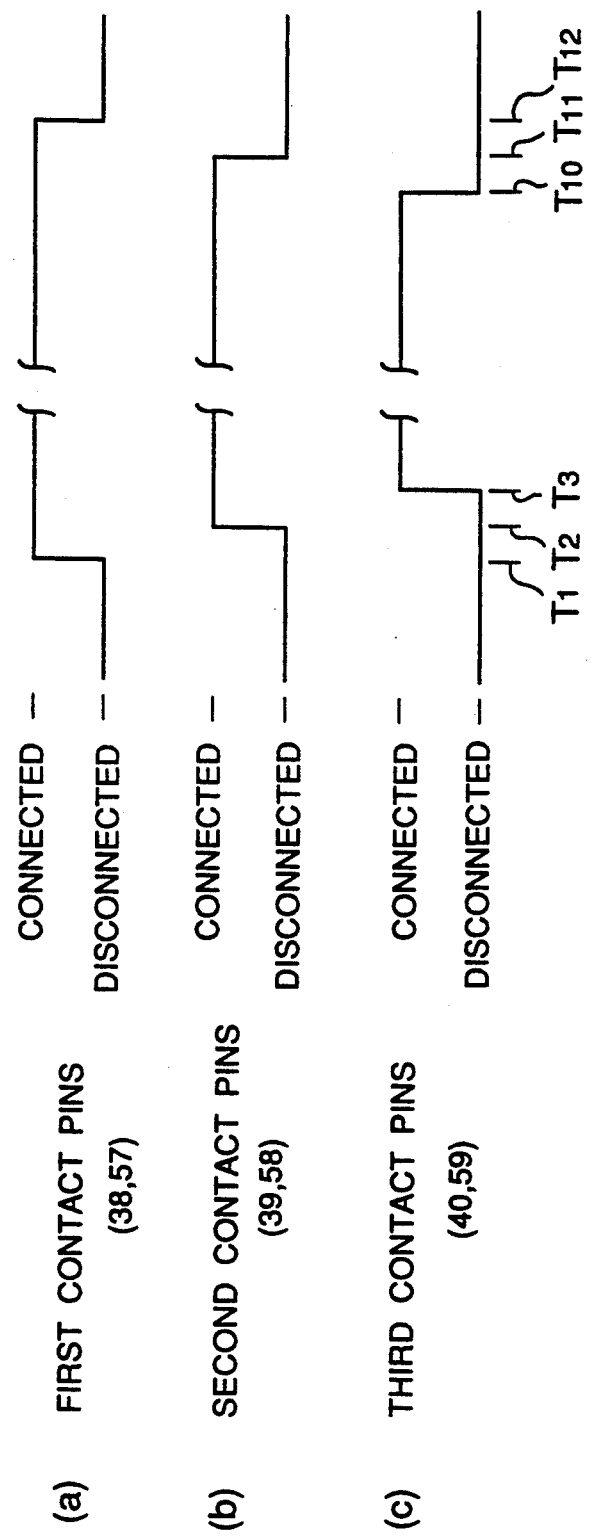
FIG. 15 is a timing chart illustrating a connecting order of contact pins of the plug-in connectors when the plug-in connectors are connected to each other.

In the second step after the above first step, the lever 55 of the plug-in package 24 is pushed down in a direction B indicated by an arrow shown in FIG. 3. When the lever 55 is pushed down, the plug-in package 24 is pivoted on a point (a fulcrum) 61 at which the pin 53 is engaged with the hole 35-1, in a clockwise direction. While the plug-in package 24 is pivoted on the point, the leaf spring 33-1 is gradually bent. Then the plug-in package 24 reaches a position at which the lower edge 56 of the circuit board 50 and the upper edge 60 thereof are parallel to the mother board 23, as shown in FIG. 13. In this state, the cover 54 of the plug-in package 24 is parallel to the front panel 25 and covers the insertion opening 31-1, as shown in FIG. 14. When the lower edge 56 of the circuit board 50 is parallel to the mother board 23, the plug-in connector 26 of the plug-in package 24 and the plug-in connector 27 mounted on the mother board 23 are completely connected to each other, as shown in FIG. 13.

A detailed description will now be given of the process for connecting the plug-in connectors 26 and 27 to each other.

When the plug-in package 24 is pivoted on the fulcrum 61, the plug-in connector 26 of the plug-in package 24 moves along an arc 62 of a circle whose center is positioned at the fulcrum 61, as shown in FIG. 3. Thus, the plug-in connector 26 does not exactly move along a straight line perpendicular to the mother board 23. However, the plug-in connector 26 is much shorter than the circuit board 50 which is pivotally moved, and the plug-in connectors 26 and 27 are parallel to each other in a state where they have been connected to each other. Thus, even if the plug-in connector 26 moves along the arc 62 of the circle having a diameter R, the plug-in connectors 26 and 27 can be normally electrically connected to each other.

Since the plug-in connector 26 moves along the arc 62 of the circle, the contact pins of the plug-in connectors 26 and 27 are gradually connected to each other in order starting from a position close to the fulcrum 61. That is, first the first contact pins 38 and 57 for grounding are connected to each other at a time T1, as shown in ,FIG. 15(a), then the second contact pins 39 and 58 for the power supply are connected to each other at a time T2, as shown in FIG. 15(b). After this, the third contact pins 40 and 59 for the signal lines are connected to each other at a time T3, as shown in FIG. 15(c). According to the above procedure of the connection of the contact pins in the plug-in connectors 26 and 27, the third contact pins 40 and 59 for the signal lines are connected to each other after the first contact pins 38 and 57 for grounding and the second contact pins 39 and 58 for the power supply are respectively connected to each other. Thus, malfunction does not occur in the communication unit 20 when the plug-in package 24 is set in the housing 21 under a condition in which the communication unit 20 is activated.

When the plug-in package 24 is detached, the above operations are carried out in reverse order. That is, the lever of the plug-in package 24 is pulled up so that the plug-in connector 26 is disconnected from the plug-in connector 27 mounted on the mother board 23. Then the plug-in package 24 is pulled out from the housing through the insertion opening 31-1. When the plug-in package 24 is pulled up, the contact pins in the plug-in connectors 26 and 27 are gradually disconnected, in order, starting from a position close to the insertion opening 31-1. That is, first the third contact pins 40 and 59 for the signals are disconnected from each other at a time T10, as shown in FIG. 15(c), then the second contact pins 39 and 58 for the power supply are disconnected from each other at a time T11, as shown in FIG. 15(b). After this, the first contact pins 38 and 57 are disconnected from each other at a time T12, as shown in FIG. 15(a). Thus, in the case of disconnection of the plug-in connectors 26 and 27, malfunction does not occur in the communication unit 20 which is in an activate state.

Figure 16A:
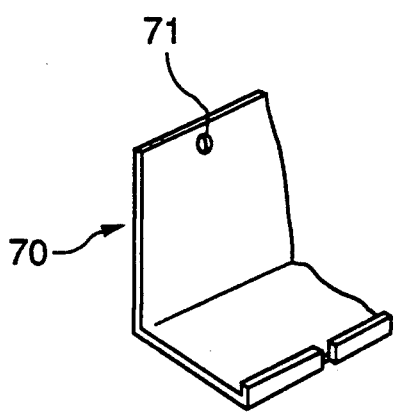
FIGS. 16A, 16B, 17A and 17B are diagrams illustrating other examples of a structure in which the L-shaped bracket pivotably supports the plug-in package.
Figure 16B:
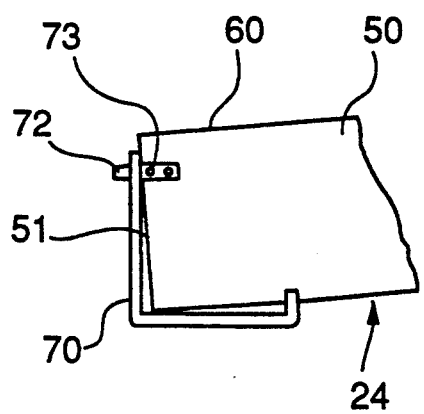

FIGS. 16A and 16B show another structure for pivotably supporting the plug-in package.

Referring to FIGS. 16A and 16B, a hole 71 is formed on an L-shaped bracket 70 close to an upper edge thereof. A pin 73 is mounted on the circuit board 50 of the plug-in package 24 close to the upper edge 60 thereof. The pin 73 projects from the leading edge 51 of the circuit board 50. The pin 72 is engaged with the hole 71, so that the plug-in package 24 can be pivoted on a point (a fulcrum) 73 at which the pin 72 is engaged with the hole 71.

Figure 17A:
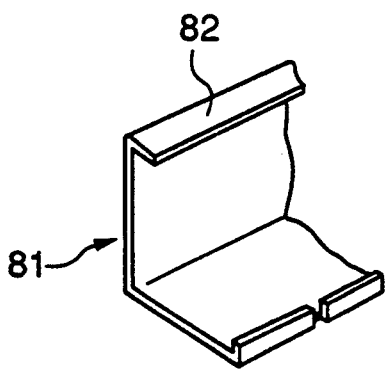
Figure 17B:
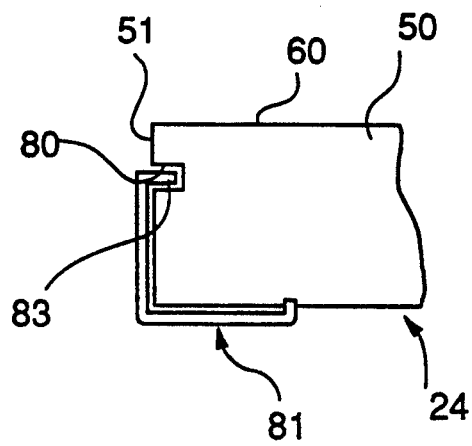

FIGS. 17A and 17B show another structure for pivotably supporting the plug-in package.

Referring to FIGS. 17A and 17B, a notch 80 is formed on the leading edge 51 of the circuit board 50 close to the upper edge 60 thereof. An L-shaped bracket 81 has a projection part 82 projecting from an upper edge of the L-shaped bracket 81. The notch of the circuit board 50 is engaged with the projection part 82 of the L-shaped bracket 81, so that the plug-in package 24 can be pivoted on a point (a fulcrum) 83 at which the notch 80 is engaged with the projection part 82.

The present invention is not limited to the aforementioned embodiments, and variations and modifications may be made without departing from the scope of the claimed invention.

What is claimed is:

1. An apparatus capable of housing a plurality of plug-in packages, each plug-in package being provided with a first circuit and a first connector having contact pins coupled to said first circuit, said apparatus comprising:
   a housing having a panel on which a plurality of insertion openings is provided through which openings said plug-in packages can be inserted into said housing, a first edge of each of said plug-in packages leading and a second edge of each of said plug-in packages trailing when inserting;
   a mother board mounted in said housing, said mother board having a second circuit and a plurality of second connectors fixed thereon, each second connector having contact pins coupled to said second circuit and corresponding to one of said insertion openings formed on said panel; and
   a first supporting member for pivotably supporting the first edge of a respective one of said plug-in packages when inserted in said housing so that said first connector can face a corresponding one of said second connectors of said mother board,
   wherein each of said plug-in packages can be pivoted so that the first connector of each of said plug-in packages can be connected to a corresponding one of said second connectors of said mother board.

2. An apparatus as claimed in claim 1, wherein said first supporting member comprises a bracket having a supporting plate facing the panel, said supporting plate having holes with each of which a pin mounted on each of said plug-in packages so as to project from the first edge is to be engaged, and wherein each of said plug-in packages can be pivoted on a point at which a respective pin is engaged with a respective hole.

3. An apparatus as claimed in claim 2 wherein said pin is mounted on a corresponding plug-in package at a position close to a surface of said mother board.

4. An apparatus as claimed in claim 2, wherein said pin is mounted on a corresponding plug-in package at a position far from a surface of said mother board.

5. An apparatus as claimed in claim 1, wherein said first supporting member comprises a bracket having a supporting plate facing the panel and a projection part projecting from said supporting plate, with which projection part a notch formed on the first edge of each of said plug-in packages is to be engaged, and wherein each of said plug-in packages can be pivoted on a point at which the notch is engaged with the projection part of said supporting plate.

6. An apparatus as claimed in claim 1, wherein each of said plug-in packages is inserted in said housing under a condition in which each of said plug-in packages is perpendicular to a surface of said mother board.

7. An apparatus as claimed in claim 6, wherein said housing has a bottom plate perpendicular to said panel, said bottom plate being provided with said mother board, and wherein the first connector of each of said plug-in packages is connected to a corresponding one of said second connectors when the second edge of each of said plug-in packages is moved toward said bottom plate.

8. An apparatus as claimed in claim 1 further comprising:
   a plurality of second supporting members provided at positions close to said insertion openings, each of said second supporting members for elastically supporting corresponding plug-in packages inserted in said housing, wherein when each of said plug-in packages is pivoted on a predetermined point on said first supporting member, a corresponding one of second supporting members is bent by the corresponding plug-in package.

9. An apparatus as claimed in claim 8, wherein each of said second supporting members comprises a leaf spring at a position close to a corresponding one of said insertion openings, for supporting each corresponding plug-in package.

10. An apparatus as claimed in claim 9, wherein said leaf spring has a U-shaped member provided at an end thereof, each of said plug-in packages being guided key by said U-shaped member.

11. An apparatus as claimed in claim 1, wherein the contact pins of each of said first and second connectors include first contact pins for a ground, said first contact pins arranged at a position closest to said first supporting member in each of said first and second connectors.

12. An apparatus as claimed in claim 11, wherein said contact pins of each of said first and second connectors include second contact pins for a power supply, said contact pins being arranged so as to be adjacent to said first pins.

13. An apparatus as claimed in claim 11, wherein said contact pins of each of said first and second connectors include third contact pins for signals said third contact pins being arranged at the closest position to the panel of said housing in each of said first and second connectors.

14. An apparatus housing a plurality of plug-in packages, each plug-in package having a first circuit and a first connector having contact pins coupled to said first circuit, said apparatus comprising:
- a housing having a panel having a plurality of insertion openings through which said plug-in packages are inserted into said housing, a first edge of each of said plug-in packages leading and a second edge of each of said plug-in packages trailing when inserting;
- a mother board mounted in said housing, said mother board having a second circuit and a plurality of second connectors fixed thereon, each second connector having contact pins coupled to said second circuit and corresponding to one of said insertion openings formed on said panel; and
- a first supporting member for pivotably supporting the first edge of a respective one of said plug-in packages which was inserted in said housing so that said first connector faces a corresponding one of said second connectors of said mother board,
- wherein each of said plug-in packages is pivoted so that the first connector of each of said plug-in packages is connected to a corresponding one of said second connectors of said mother board.

15. An apparatus as claimed in claim 14, wherein said first supporting member comprises a bracket having a supporting plate having holes with each of which a pin mounted on each of said plug-in packages so as to project from the first edge is to be engaged, and wherein each of said plug-in packages can be pivoted on a point at which a respective pin is engaged with a respective hole.

16. An apparatus as claimed in claim 15, wherein said pin is mounted on a corresponding plug-in package at a position close to a surface of said mother board.

17. An apparatus as claimed in claim 15, wherein said pin is mounted on a corresponding plug-in package at a position far from a surface of said mother board.

18. An apparatus as claimed in claim 14, wherein said first supporting member comprises a bracket having a supporting plate facing the panel and a projection part projecting from said supporting plate, with which projection part a notch formed on the first edge of each of said plug-in packages is to be engaged, and wherein each of said plug-in packages can be pivoted on a point at which the notch is engaged with the projection part of said supporting plate.

19. An apparatus as claimed in claim 14, wherein each of said plug-in packages is inserted in said housing under a condition in which each of said plug-in packages is perpendicular to a surface of said mother board.

20. An apparatus as claimed in claim 19, wherein said housing has a bottom plate perpendicular to said panel, said bottom plate being provided with said mother board, and wherein the first connector of each of said plug-in packages is connected to a corresponding one of said second connectors when the second edge of each of said plug-in packages is moved toward said bottom plate.

21. An apparatus as claimed in claim 14, further comprising:
- a plurality of second supporting members provided a positions close to said insertion openings, each of said second supporting members for elastically supporting corresponding plug-in packages inserted in said housing, wherein when each of said plug-in packages is pivoted on a predetermined point on said first supporting member, a corresponding one of the second supporting members is bent by a corresponding plug-in package.

22. An apparatus as claimed in claim 21, wherein each of said second supporting members comprises a leaf spring at a position close to a corresponding one of said insertion openings, for supporting each corresponding plug-in package.

23. An apparatus as claimed in claim 22, wherein said leaf spring has a U-shaped member provided at an end thereof, each of said plug-in packages being guided by said U-shaped member.

24. An apparatus as claimed in claim 14, wherein the contact pins of each of said first and second connectors include first contact pins for a ground, said first contact pins being arranged at a position closest to said first supporting member in each of said first and second connectors.

25. An apparatus as claimed in claim 24, wherein said contact pins of each of said first and second connectors include second contact pins for a power supply, said contact pins being arranged so as to be adjacent to said first pins.

26. An apparatus as claimed in claim 24, wherein said contact pins of each of said first and second connectors include third contact pins for signals, said third contact pins being arranged at the closest position to the panel of said housing in each of said first and second connectors.

* * * * *